(12) United States Patent
Kawamata et al.

(10) Patent No.: US 9,202,707 B2
(45) Date of Patent: Dec. 1, 2015

(54) SEMICONDUCTOR DEVICE MANUFACTURING METHOD

(71) Applicant: Tokyo Electron Limited, Tokyo (JP)

(72) Inventors: Masaya Kawamata, Miyagi (JP); Masanobu Honda, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 14/376,644

(22) PCT Filed: Feb. 5, 2013

(86) PCT No.: PCT/JP2013/052633
§ 371 (c)(1),
(2) Date: Aug. 5, 2014

(87) PCT Pub. No.: WO2013/121936
PCT Pub. Date: Aug. 22, 2013

(65) Prior Publication Data
US 2014/0363980 A1 Dec. 11, 2014

Related U.S. Application Data

(60) Provisional application No. 61/603,405, filed on Feb. 27, 2012.

(30) Foreign Application Priority Data

Feb. 17, 2012 (JP) .................................. 2012-033372

(51) Int. Cl.
*B44C 1/22* (2006.01)
*H01L 21/3065* (2006.01)
(Continued)

(52) U.S. Cl.
CPC ....... *H01L 21/3065* (2013.01); *H01J 37/32091* (2013.01); *H01J 37/32165* (2013.01); *H01L 21/0273* (2013.01); *H01L 21/308* (2013.01); *H01L 21/31116* (2013.01);
(Continued)

(58) Field of Classification Search
CPC ..................... H01L 21/0273; H01L 21/31116
USPC .................. 216/41, 67, 59; 438/706, 710, 723
See application file for complete search history.

(56) References Cited

U.S. PATENT DOCUMENTS 6,635,185 B2 * 10/2003 Demmin et al. ................ 216/64
2007/0281491 A1 * 12/2007 Kamp .......................... 438/717
(Continued)

FOREIGN PATENT DOCUMENTS

JP 2009-266944 11/2009

*Primary Examiner* — Shamim Ahmed
(74) *Attorney, Agent, or Firm* — IPUSA, PLLC

(57) ABSTRACT

A semiconductor device manufacturing method is provided that includes etching with a plasma a multilayer film including a first film and a second film with differing dielectric constants alternately stacked on a substrate using a photoresist layer arranged on the multilayer film as a mask, and forming the multilayer film into a stepped configuration. The semiconductor device manufacturing method includes repetitively performing a first step of etching the first film using the photoresist layer as the mask; a second step of adjusting a pressure within a processing chamber to 6-30 Torr, generating the plasma by applying a first high frequency power for biasing and a second high frequency power for plasma generation to the lower electrode, and etching the photoresist layer using the generated plasma; and a third step of etching the second film using the photoresist layer and the first film as the mask.

8 Claims, 11 Drawing Sheets

(51) Int. Cl.
*H01L 21/308* (2006.01)
*H01L 21/027* (2006.01)
*H01L 21/311* (2006.01)
*H01L 27/115* (2006.01)
*H01J 37/32* (2006.01)
*H01L 21/768* (2006.01)

(52) U.S. Cl.
CPC ... *H01L 21/31138* (2013.01); *H01L 21/31144* (2013.01); *H01L 21/76838* (2013.01); *H01L 27/11556* (2013.01); *H01L 27/11582* (2013.01); *H01J 2237/334* (2013.01)

(56) References Cited

U.S. PATENT DOCUMENTS

| | | | |
|---|---|---|---|
| 2009/0050271 A1* | 2/2009 | Goyal et al. | 156/345.25 |
| 2012/0119287 A1* | 5/2012 | Park et al. | 257/329 |
| 2012/0306089 A1* | 12/2012 | Freeman et al. | 257/773 |

\* cited by examiner

FIG.9

| | | 1 Torr | 5 Torr | 9 Torr |
|---|---|---|---|---|
| COMPARATIVE EXAMPLE | LF 0W | TRIM RATIO : 0.37<br>LATERAL E/R : 117 nm/min | TRIM RATIO : 0.63<br>LATERAL E/R : 226 nm/min | TRIM RATIO : 0.42<br>LATERAL E/R : 29 nm/min |
| EMBODIMENT 1 | LF 200W | TRIM RATIO : 0.35<br>LATERAL E/R : 189 nm/min | TRIM RATIO : 0.70<br>LATERAL E/R : 268 nm/min | TRIM RATIO : 0.82<br>LATERAL E/R : 301 nm/min |
| EMBODIMENT 2 | LF 500W | TRIM RATIO : 0.30<br>LATERAL E/R : 170 nm/min | TRIM RATIO : 0.63<br>LATERAL E/R : 256 nm/min | TRIM RATIO : 0.71<br>LATERAL E/R : 237 nm/min |

FIG.10

| | | 0.1Torr | 0.5Torr | 1Torr | 5Torr |
|---|---|---|---|---|---|
| COMPARATIVE EXAMPLE | LF 0W | TRIM RATIO: 0.12<br>LATERAL E/R: 20 nm/min | TRIM RATIO: 0.14<br>LATERAL E/R: 14 nm/min | TRIM RATIO: 0.09<br>LATERAL E/R: 8 nm/min | TRIM RATIO: 0<br>LATERAL E/R: 0 nm/min |
| EMBODIMENT 1 | LF 200W | TRIM RATIO: 0.15<br>LATERAL E/R: 70 nm/min | TRIM RATIO: 0.30<br>LATERAL E/R: 118 nm/min | TRIM RATIO: 0.39<br>LATERAL E/R: 75 nm/min | TRIM RATIO: 0.44<br>LATERAL E/R: 35 nm/min |
| EMBODIMENT 2 | LF 500W | TRIM RATIO: 0.15<br>LATERAL E/R: 120 nm/min | TRIM RATIO: 0.24<br>LATERAL E/R: 175 nm/min | TRIM RATIO: 0.31<br>LATERAL E/R: 117 nm/min | TRIM RATIO: 0.38<br>LATERAL E/R: 48 nm/min |

SEMICONDUCTOR DEVICE MANUFACTURING METHOD

CROSS-REFERENCE TO RELATED APPLICATIONS

The present application is a National Stage of International Application No. PCT/JP2013/052633 filed on Feb. 5, 2013, claiming priority based on Japanese Patent Application No. 2012-033372 filed on Feb. 17, 2012, and U.S. Provisional Application No. 61/603,405 filed on Feb. 27, 2012, the entire contents of which are hereby incorporated by reference.

TECHNICAL FIELD

The present invention relates to a semiconductor device manufacturing method.

BACKGROUND ART

Manufacturing a three-dimensional (3D) stacked semiconductor memory such as the 3D NAND flash memory includes a process of etching a multilayer stacked film into a stepped configuration using a plasma (see e.g. Patent Document 1). When performing mask trimming in such a process, it is important to increase the etch rate of etching a mask material in the lateral direction with respect to the etch rate of etching in the vertical direction.

Conventionally, the above effect is achieved by decreasing an ion energy of ions that contribute to etching the mask material in the vertical direction so that etching in the vertical direction may be suppressed and encouraging isotropic etching by radicals.

PRIOR ART DOCUMENTS

Patent Documents

Patent Document 1: Japanese Laid-Open Patent Publication No. 2009-266944

SUMMARY OF THE INVENTION

Problem to be Solved by the Invention

However, when the above method is employed, the etch rate of the mask material may decrease owing to the decrease in the ion energy. Accordingly, there is a demand for a method of increasing the etch rate for etching the mask material in the lateral direction while increasing throughput.

In light of the above, one aspect of the present invention relates to providing a semiconductor device manufacturing method that is capable of increasing the etch rate for etching the mask material in the lateral direction and increasing throughput.

Means for Solving the Problem

According to one embodiment of the present invention, a semiconductor device manufacturing method is provided that includes introducing a processing gas into a parallel plate type plasma processing apparatus including an upper electrode and a lower electrode, applying a high frequency power to the lower electrode, generating a plasma within the plasma processing apparatus, etching with the plasma a multilayer film including a first film and a second film with differing dielectric constants alternately stacked on a substrate using a photoresist layer arranged on the multilayer film as a mask, and forming the multilayer film into a stepped configuration. The semiconductor device manufacturing method includes a first step of etching the first film using the photoresist layer as the mask; a second step of adjusting a pressure within a processing chamber of the plasma processing apparatus to be greater than or equal to 6 Torr and less than or equal to 30 Torr, generating the plasma by applying a first high frequency power for biasing and a second high frequency power for plasma generation to the lower electrode, and etching the photoresist layer using the generated plasma to reduce an area of the photoresist layer in a lateral direction; and a third step of etching the second film using the photoresist layer and the first film as the mask. The first step through the third step are repeated a predetermined number of times.

Advantageous Effect of the Invention

According to an aspect of the present invention, a semiconductor device manufacturing method may be provided that is capable of increasing the etch rate for etching the mask material in the lateral direction and increasing throughput.

BRIEF DESCRIPTION OF THE DRAWINGS

FIG. 9 illustrates experimental results of lateral etching executed by a plasma processing apparatus A according to Embodiments 1, 2, and a Comparison Example;

FIG. 10 illustrates experimental results of lateral etching executed by a plasma processing apparatus B according to Embodiments 1, 2, and the Comparison Example.

EMBODIMENTS FOR IMPLEMENTING THE INVENTION

Figure 1:
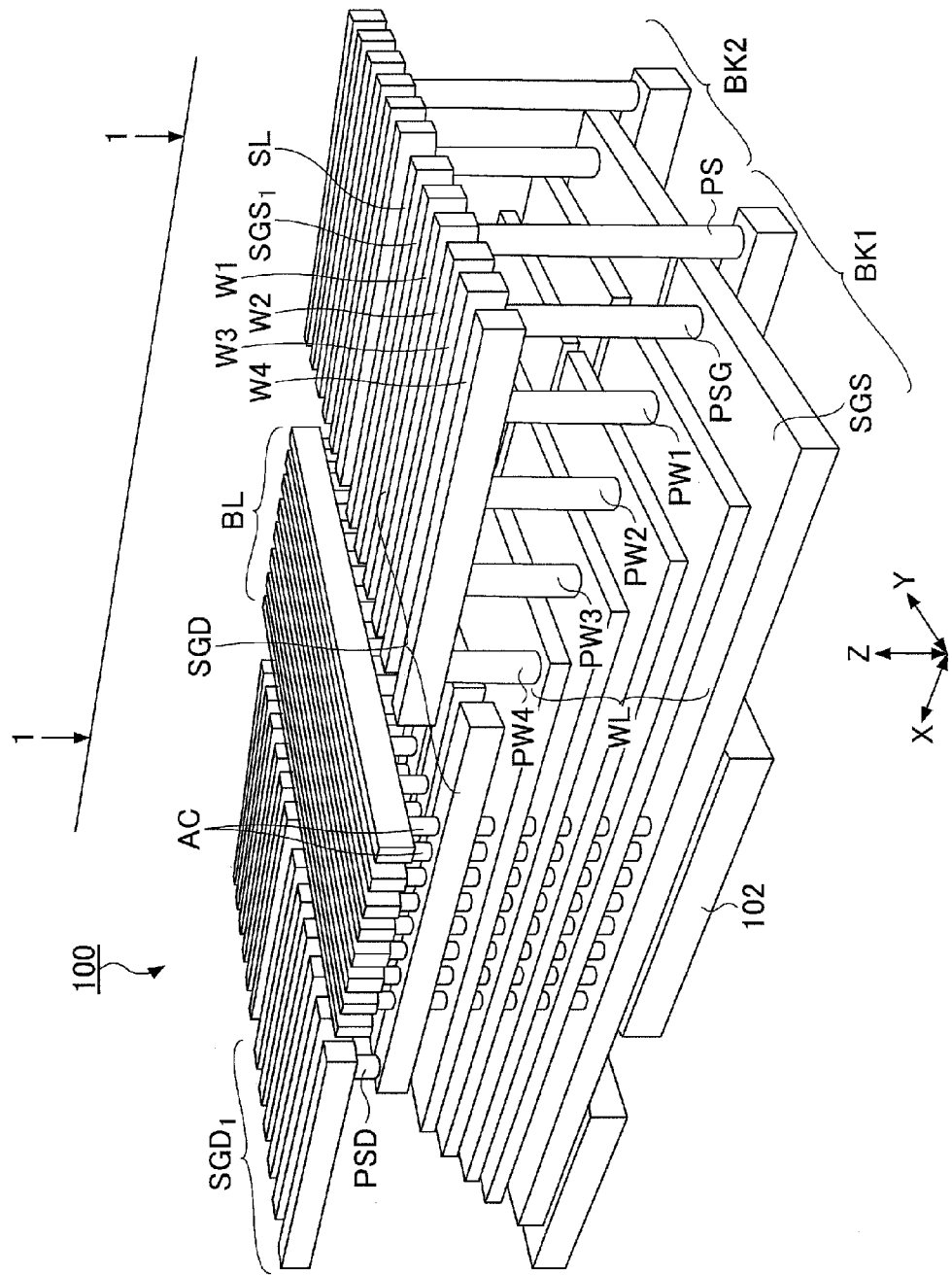
FIG. 1 schematically illustrates a configuration of a 3D stacked semiconductor memory according to an embodiment of the present invention.

In the following, embodiments of the present invention are described with reference to the accompanying drawings. Note that elements having substantially the same functions or features may be given the same reference numerals and overlapping descriptions thereof may be omitted.

[Configuration of 3D Stacked Semiconductor Memory]

Figure 2:
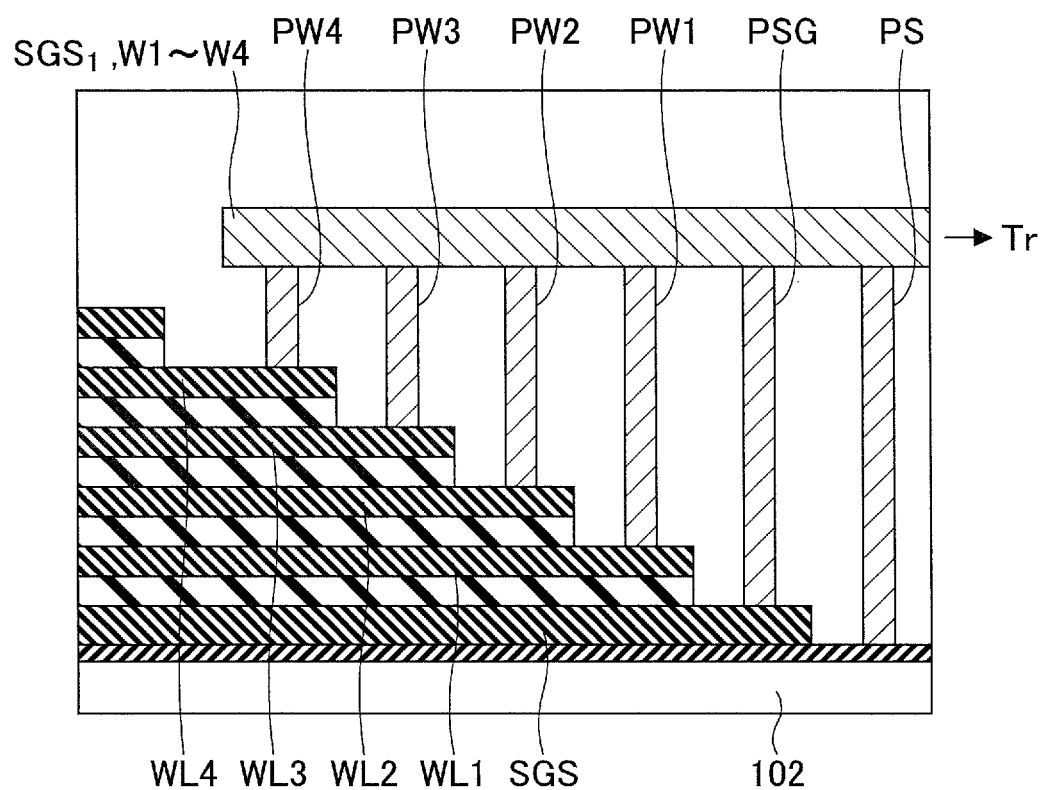
FIG. 2 is a cross-sectional view along line 1-1 of FIG. 1.

In the following, an example of a 3D stacked semiconductor memory produced using a semiconductor device manufacturing method according to an embodiment of the present invention is described with reference to FIGS. 1 and 2. FIG. 1 is a perspective view schematically illustrating a configuration of 3D NAND flash memory. FIG. 2 is a cross-sectional view along line 1-1 of the 3D NAND flash memory illustrated in FIG. 1. The 3D NAND flash memory is an example of a 3D stacked semiconductor memory.

The 3D NAND flash memory 100 illustrated in FIG. 1 is made up of a plurality of blocks each constituting a unit for erasure, for example. In FIG. 1, two blocks BK1 and BK2 are illustrated. A source diffusion layer 102 formed within a semiconductor substrate may be provided as a common layer for all the blocks of the 3D NAND flash memory 100, for example. The source diffusion layer 102 is connected to a source line SL via a contact plug PS. A first film and a second film having differing relative dielectric constants may be alternately stacked on the source diffusion layer 102 to form a stacked multilayer film, for example. Note that although the multilayer film is illustrated by a 6-layer structure in FIG. 1 for the sake of convenience, the multilayer film be made up of 16 layers, 32 layers, or even more layers.

In FIG. 1, five films corresponding to the five layers other than the uppermost layer of the multilayer structure are arranged into plates within each of the blocks BK1 and BK2, and their X-direction end portions are arranged into a stepped configuration in order to establish contact with each of the films. In this way, the multilayer film is arranged into a pyramid shape. The lowermost layer of the multilayer film corresponds to a source line side select gate line SGS, and the four layers other than the lowermost layer and the uppermost layer correspond to word lines WL.

The uppermost layer is made up of a plurality of conductive lines extending in the X direction. For example, six conductive lines may be arranged within one block BK1. For example, the six conductive lines of the uppermost layer may correspond to six bit line side select gate lines SGD.

A plurality of active layers AC for configuring a NAND cell unit are arranged into columns extending in the Z direction (i.e. vertical direction with respect to semiconductor substrate surface) to penetrate through the plurality of layers and reach the source diffusion layer 102.

A plurality of bit lines BL extending in the Y direction are connected to the upper ends of the plurality of active layers AC. Also, the source line side select gate line SGS is connected to a leader line $SGS_1$ extending in the X direction via a contact plug PSG. The word lines WL are connected to leader lines W1-W4 extending in the X direction via contact plugs PW1-PW4.

Further, the bit line side select gate lines SGD are connected to leader lines $SGD_1$ extending in the X direction via contact plugs PSD. The plurality of bit lines BL, the leader lines $SGD_1$, and the leader lines WL1-WL4 may be made of metal, for example.

FIG. 2 is a cross-sectional view along line 1-1 of FIG. 1. The source line side select gate line SGS and word lines WL1-WL4 are connected to a transistor Tr included in a driver (not shown) via the contact plug PSG and the contact plugs PW1-PW4, which establish connection with the leader line $SGS_1$ and the leader lines W1-W4 extending in the X direction.

[Overall Configuration of Plasma Processing Apparatus]

Figure 3:
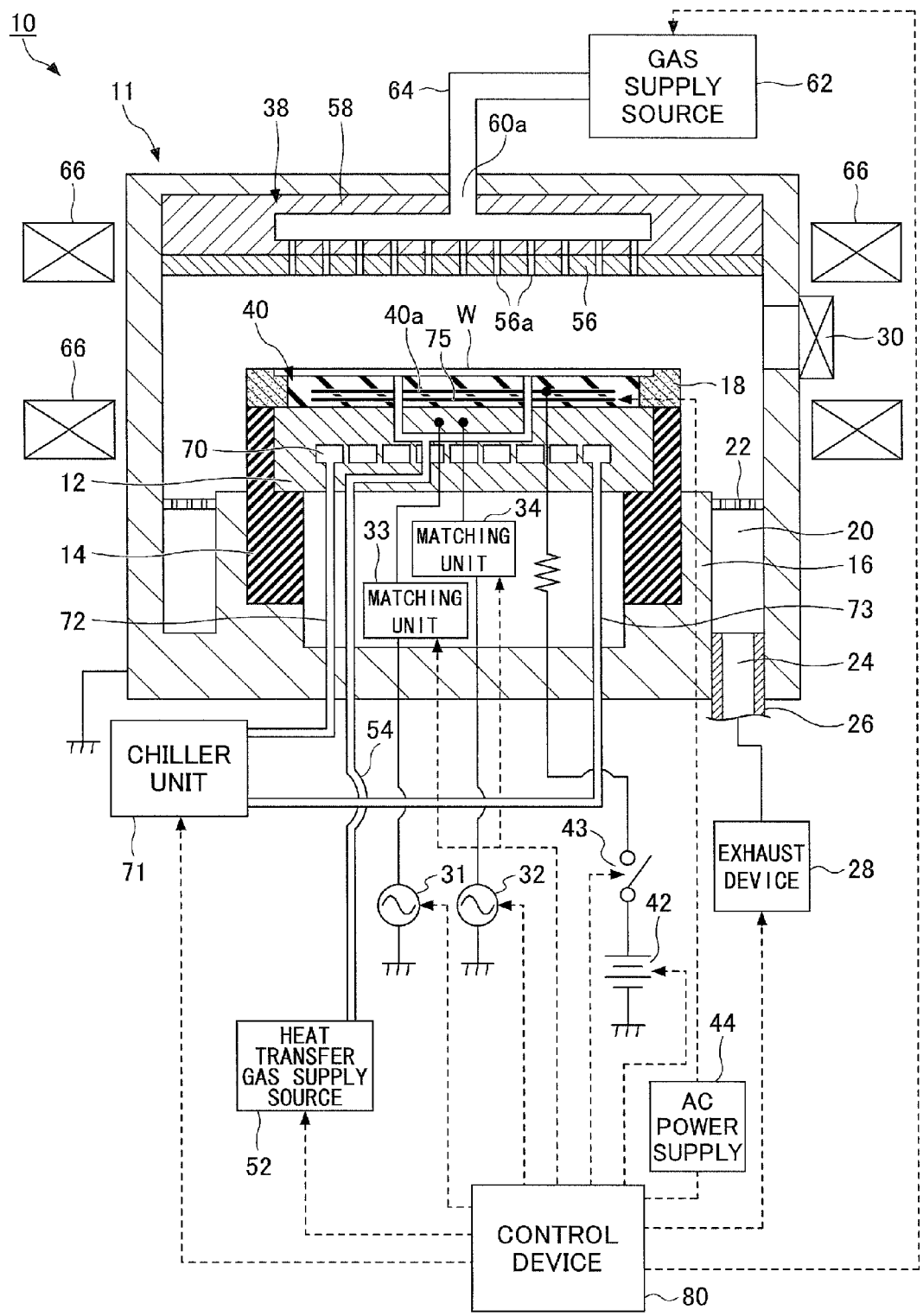
FIG. 3 is a longitudinal cross-sectional view illustrating an overall configuration of a semiconductor device manufacturing apparatus according to an embodiment of the present invention.

In the following, an overall configuration of a plasma processing apparatus as an example of a semiconductor device manufacturing apparatus according to an embodiment of the present invention is described with reference to FIG. 3. The plasma processing apparatus 10 illustrated in FIG. 3 is configured as a lower side dual frequency parallel plate type plasma etching apparatus (capacitively coupled plasma etching apparatus). The plasma processing apparatus 10 includes a cylindrical vacuum chamber (processing chamber) 11 (simply referred to as "chamber" hereinafter) made of aluminum having an alumite-treated (anodized) surface, for example. The chamber 11 may be grounded, for example.

A mounting table 12 configured to hold a semiconductor wafer W (hereinafter, simply referred to as a "wafer W") thereon as a workpiece is arranged within the chamber 11. The mounting table 12 may be made of aluminum, for example, and is supported on a cylindrical support 16 via an insulating cylindrical holder 14. The cylindrical support 16 extends vertically upward from a bottom of the chamber 11. To improve in-plane etching uniformity, a focus ring 18 that may be made of silicon, for example, is arranged on a top surface of the mounting table to surround the outer edge of an electrostatic chuck 40.

An exhaust path 20 is formed between a sidewall of the chamber 11 and the cylindrical support 16. A ring-shaped baffle plate 22 is arranged in the exhaust path 20. An exhaust port 24 is formed at a bottom portion of the exhaust path 20 and is connected to an exhaust device 28 via an exhaust line 26. The exhaust device 28 includes a vacuum pump (not shown) and is configured to depressurize a processing space within the chamber 11 to a predetermined vacuum level. A gate valve 30 configured to open/close an entry/exit port for the wafer W is provided at the sidewall of the chamber 11.

A first high frequency power supply 31 for drawing ions from within the plasma (for biasing) and a second high frequency power supply 32 for plasma generation are electrically connected to the mounting table 12 via a matching unit 33 and a matching unit 34, respectively. The first high frequency power supply 31 is configured to apply to the mounting table 12 a first high frequency power having a suitable frequency such as 3.2 MHz for drawing ions from within a plasma. The second high frequency power supply 31 is configured to apply to the mounting table 12 a second high frequency power having a frequency such as 100 MHz for generating a plasma within the chamber 11. In this way, the mounting table 12 also acts as a lower electrode. Further, a shower head 38, which is described below, is provided at a ceiling portion of the chamber 11. The shower head 38 acts as an upper electrode at a ground potential. In this way, the second high frequency power from the second high frequency power supply 32 is capacitively applied between the mounting table 12 and the shower head 38.

The electrostatic chuck 40 configured to hold the wafer W by an electrostatic attractive force is provided on the top surface of the mounting table 12. The electrostatic chuck 40 includes an electrode 40a that is made of a conductive film and is arranged between a pair of insulating films. A DC voltage supply 42 is electrically connected to the electrode 40a via a switch 43. The electrostatic chuck 40 electrostatically attracts and holds the wafer W by a Coulomb force that is generated when a voltage is applied thereto from the DC voltage supply 42.

A heat transfer gas supply source 52 is configured to supply a heat transfer gas such as He gas between the backside surface of the wafer W and the top surface of the electrostatic chuck 40 through a gas supply line 54.

The shower head 38 disposed at the ceiling portion of the chamber 11 includes an electrode plate 56 having multiple gas holes 56a and an electrode supporting body 58 configured to detachably hold the electrode plate 56. The gas supply source 62 supplies gas to the shower head 38 via a gas supply pipe 64, which is connected to a gas inlet 60a. In this way, the gas may be introduced into the chamber 11 from the multiple gas holes 56a.

A magnet 66 is arranged to extend annularly or concentrically around the chamber 11 such that the magnetic force of the magnet 66 may act to keep plasma confined within a plasma generation space of the chamber 11.

A coolant path 70 is formed within the mounting table 12. A coolant cooled to a predetermined temperature is supplied to the coolant path 70 from a chiller unit 71 via pipes 72 and 73. Also, a heater 75 is arranged at the lower side of the electrostatic chuck 40. A desired AC voltage is applied to the heater 75 from an AC power supply 44. In this way, the temperature of the wafer W may be adjusted to a desired temperature through cooling by the chiller unit 71 and heating by the heater 75. Note that such temperature control is performed based on a command from a control device 80.

The control device 80 is configured to control the individual components of the plasma processing apparatus 10 such as the exhaust device 28, the AC power supply 44, the DC voltage supply 42, the switch 43 for the electrostatic chuck, the first high frequency power supply 31, the second high frequency power supply 32, the matching units 33 and 34, the heat transfer gas supply source 52, the gas supply source 62, and the chiller unit 71. Note that the control device 80 is also connected to a host computer (not shown).

The control device 80 includes a CPU (Central Processing Unit), a ROM (Read Only Memory), and a RAM (Random Access Memory), which are not shown. The CPU executes a plasma process according to various recipes stored in a storage unit (not shown). The storage unit storing the recipes may be configured by RAM or ROM using a semiconductor memory, a magnetic disk, or an optical disk, for example. The recipes may be stored in a storage medium and loaded in the storage unit via a driver (not shown), for example. Alternatively, the recipes may be downloaded to the storage unit via a network (not shown), for example. Also, note that a DSP (digital signal processor) may be used instead of the CPU to perform the above functions. The functions of the control device 80 may be implemented by software, hardware, or a combination thereof.

When performing an etching process using the plasma processing apparatus 10 having the above-described configuration, first, the gate valve 30 is opened, and the wafer W is loaded into the chamber 11 while being held by a transfer arm. Then, the wafer W is held by pusher pins (not shown), and the wafer W is placed on the electrostatic chuck 40 when the pusher pins are lowered. After the wafer W is loaded, the gate valve 30 is closed. Then, an etching gas is introduced into the chamber 11 from the gas supply source 62 at a predetermined flow rate and flow rate ratio, and the internal pressure of the chamber 11 is reduced to a predetermined pressure by the exhaust device 28. Further, high frequency powers at predetermined power levels are supplied to the mounting table 12 from the first high frequency power supply 31 and the second high frequency power supply 32. Also, a voltage from the DC voltage supply 42 is applied to the electrode 40a of the electrostatic chuck 40 so that the wafer W may be fixed to the electrostatic chuck 40. The heat transfer gas supply source 52 supplies a heat transfer gas such as He gas between the top surface of the electrostatic chuck 40 and the backside surface of the wafer W. Etching gas sprayed into the chamber 11 from the shower head 38 is excited into a plasma by the second high frequency power from the second high frequency power supply 32. As a result, a plasma is generated within the plasma generation space between the upper electrode (shower head 38) and the lower electrode (mounting table 12), and a main surface of the wafer W is etched by the generated plasma.

Also, ions within the plasma may be drawn toward the wafer W by the first high frequency power from the first high frequency power supply 31.

After plasma etching is completed, the wafer W is lifted and held by the pusher pins, the gate valve 30 is opened, and the transfer arm is introduced into the chamber 11. Then, the pusher pins are lowered so that the wafer W may be held by the transfer arm. Then, the transfer arm exits the chamber 11, and a next wafer W is loaded into the chamber 11 by the transfer arm. By repeating the above-described procedures, wafers W may be successively processed.

[Etching Steps for Forming Stepped Configuration]

Figure 4:
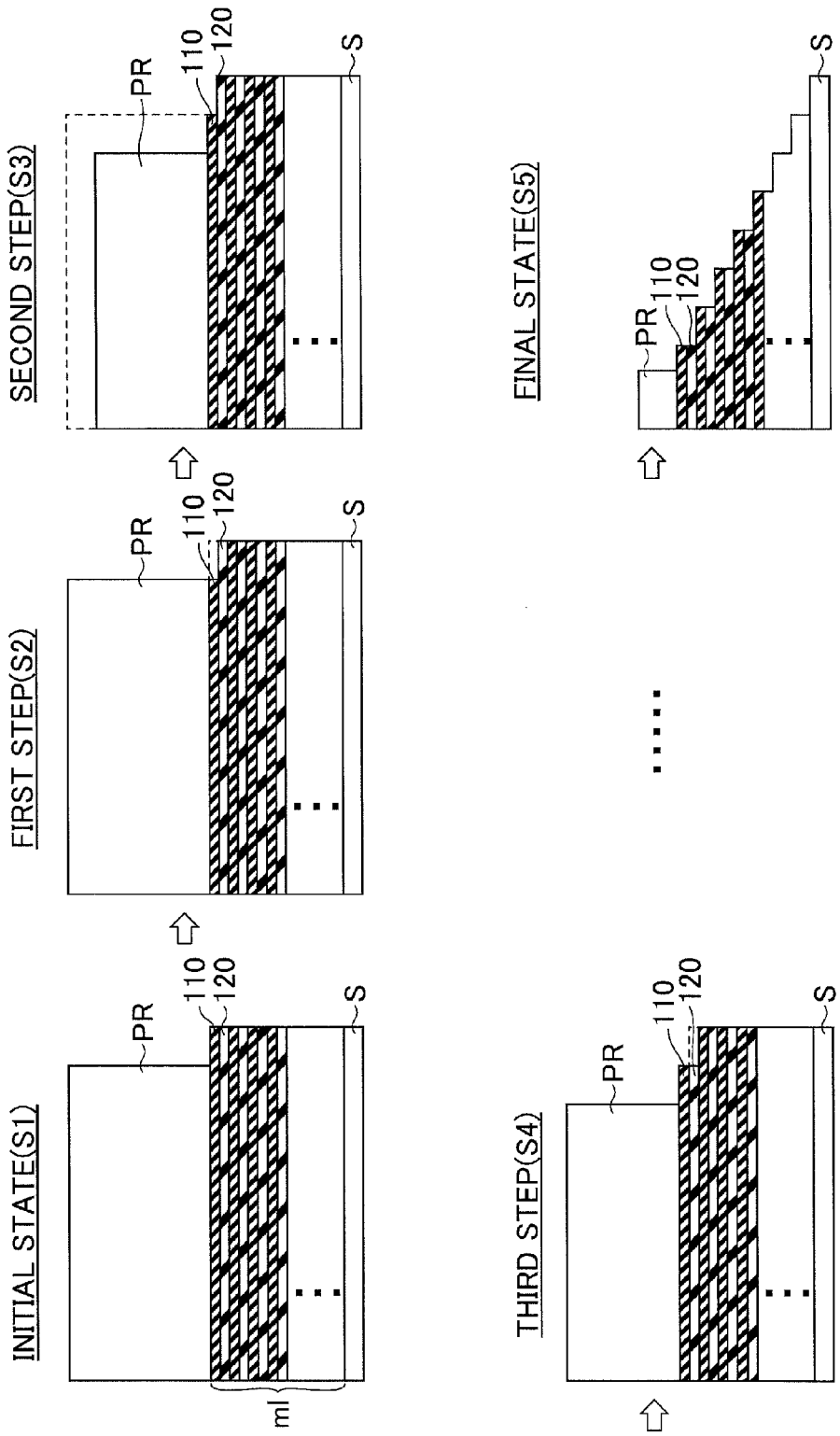
FIG. 4 illustrates etching steps of a semiconductor device manufacturing method according to an embodiment of the present invention.

In the following, etching steps executed in a semiconductor device manufacturing method according to an embodiment of the present invention are described with reference to FIG. 4. FIG. 4 illustrates an initial state (S1) before etching steps of the present embodiment are started, a first step (S2), a second step (S3), a third step (S4), and a final state (S5) after the etching steps are completed.

In the present embodiment, a stepped configuration is formed on a multilayer film.

<Initial State (S1) Before Starting Etching Steps>

In the present embodiment, a 36-layer multilayer film ml having a first film 110 and a second film 120 alternately stacked on a substrate S is formed. Note that the multilayer film ml may be a stacked film having at least 16 layers of the first film 110 and the second film 120 alternately arranged on each other, for example.

The first film 110 and the second film 120 are insulating films having differing relative dielectric constants. In the present embodiment, a silicon oxide ($SiO_2$) film is used as the first film 110 and a silicon nitride (SiN) film is used as the second film 120 to form the multilayer film ml made up of films having differing relative dielectric constants.

Note, however, that the combination of the first film 110 and the second film 120 is not limited to the above silicon oxide film/silicon nitride film combination. In one alternative example, a polysilicon (impurity-doped) film may be used as the first film 110 and a polysilicon (non-doped) film may be used as the second film 120. In this case, the first film 110 and the second film 120 have differing relative dielectric constants based on whether impurities are doped. Note that a material such as boron may be doped as an impurity, for example.

As other exemplary combinations of the first film 110 and the second film 120, a silicon oxide ($SiO_2$) film may be used as the first film 110 and a polysilicon (impurity-doped) film may be used as the second film 120, or a silicon oxide ($SiO_2$) film may be used as the first film 110 and a polysilicon (non-doped) film may be used as the second film 120.

A photoresist layer PR that acts as a mask is arranged directly above the multilayer film ml. By etching the photoresist layer PR primarily in the lateral direction, a stepped configuration may be formed at the multilayer film ml. The photoresist layer PR may be made of an organic film or an amorphous carbon (α-C) film, for example. Also, the photoresist layer PR may be an i-line (365 nm wavelength) photoresist layer, for example.

<First Step (S2)>

In the first step, the photoresist layer PR is used as a mask to etch the silicon oxide ($SiO_2$) film corresponding to the first film 110. In this step, a so-called normal etching process is performed where etching in the vertical direction is encouraged by the ion energy. The process conditions for this step are as follows:

First Step Process Conditions

| | |
|---|---|
| Pressure | 30 mT (=3.99966 Pa) |
| First High Frequency Power/Second High Frequency Power | 1000/400 W (141.5 W/cm$^2$, 56.6 W/cm$^2$) |
| Gas Type & Gas Flow Rate | $O_2$/Ar/$C_4F_6$ = 30/1000/16 sccm |

<Second Step (S3)>

In the second step, the photoresist layer PR is etched. In the second step, the etch rate for etching in the lateral direction is increased with respect to the etch rate for etching in the vertical direction, and process conditions are optimized such that the photoresist layer PR may be etched in the lateral direction as much as possible. The process conditions for etching the photoresist layer PR in the lateral direction are described in detail below.

<Third Step (S4)>

In the third step, the photoresist layer PR and the first film 110 are used as the mask to etch the second film 120. In this etching step, etching in the vertical direction is encouraged by the ion energy, and the following process conditions are used:

Third Step Process Conditions

| | |
|---|---|
| Pressure | 150 mT (=19.9983 Pa) |
| First High Frequency Power/Second High Frequency Power | 300/800 W (42.5 W/cm$^2$, 113.2 W/cm$^2$) |
| Gas Type & Gas Flow Rate | $CH_2F_2$/Ar/$C_2$ = 140/400/70 sccm |

<Final State (S5) after Etching Steps are Completed>

In the present embodiment, the first step through the third step are repeatedly executed. In this way, the multilayer ml may be formed into a stepped configuration.

[Lateral Etching (Second Step)]

As described above, in the first step and the third step, the so-called normal etching process is performed in which etching in the vertical direction is primarily encouraged. On the other hand, the second step calls for a technique for selectively etching the photoresist layer PR in the lateral direction rather than the vertical direction.

A technique for actively etching the photoresist layer PR in the lateral direction has not been readily available. Typically, to selectively etch the photoresist layer PR in the lateral direction, a technique has been used that involves suppressing etching in the vertical direction by decreasing the ion energy contributing to vertical etching of the photoresist layer PR and encouraging isotropic etching by radicals. However, when this technique is used, because the ion energy is decreased, the etch rate is decreased and a longer processing time is required, thereby leading to a decrease in throughput.

On the other hand, if the ion energy is increased by applying biasing power to the substrate S without implementing any countermeasures, although the lateral etch rate may be accelerated, the vertical etch rate is accelerated even further such that selective etching in the lateral direction becomes difficult.

Note, also, that etching the photoresist layer PR in the lateral direction is difficult in the first place, and the photoresist layer PR is inevitably etched in the vertical direction in this case. Consequently, the photoresist layer PR may be gone before the lowermost layer of the multilayer ml is processed to complete the formation of a stepped configuration.

Thus, in order to increase the etch rate for etching the photoresist layer PR in the lateral direction and increase throughput at the same time, a technique is in demand for increasing a ratio of the lateral etch rate with respect to the vertical etch rate; namely, a photoresist layer trim ratio (lateral etch rate/vertical etch rate) corresponding to an index of etching in the lateral direction.

In view of the above, a semiconductor device manufacturing method according to an embodiment of the present invention involves not only encouraging isotropic etching by radicals but also increasing a contribution ratio of ions to lateral etching over vertical etching and increasing the photoresist layer trim ratio. Accordingly, process conditions are adjusted so that incidence of ions in the lateral direction may be increased. In the following, measures for optimizing process conditions for increasing the etch rate in the lateral direction is described.

(Pressure and Ion Angle Distribution)

In a typical method for encouraging etching in the lateral direction that involves decreasing the ion energy to decrease the contribution ratio of ions to etching and increasing the contribution ratio of radicals to etching in relativity, a high frequency power for biasing is not applied to the lower electrode to draw ions from within a plasma in a vertical direction toward the substrate. Also, in the typical method, the pressure is set to approximately several hundred mTorr upon performing the etching process.

Figure 5:
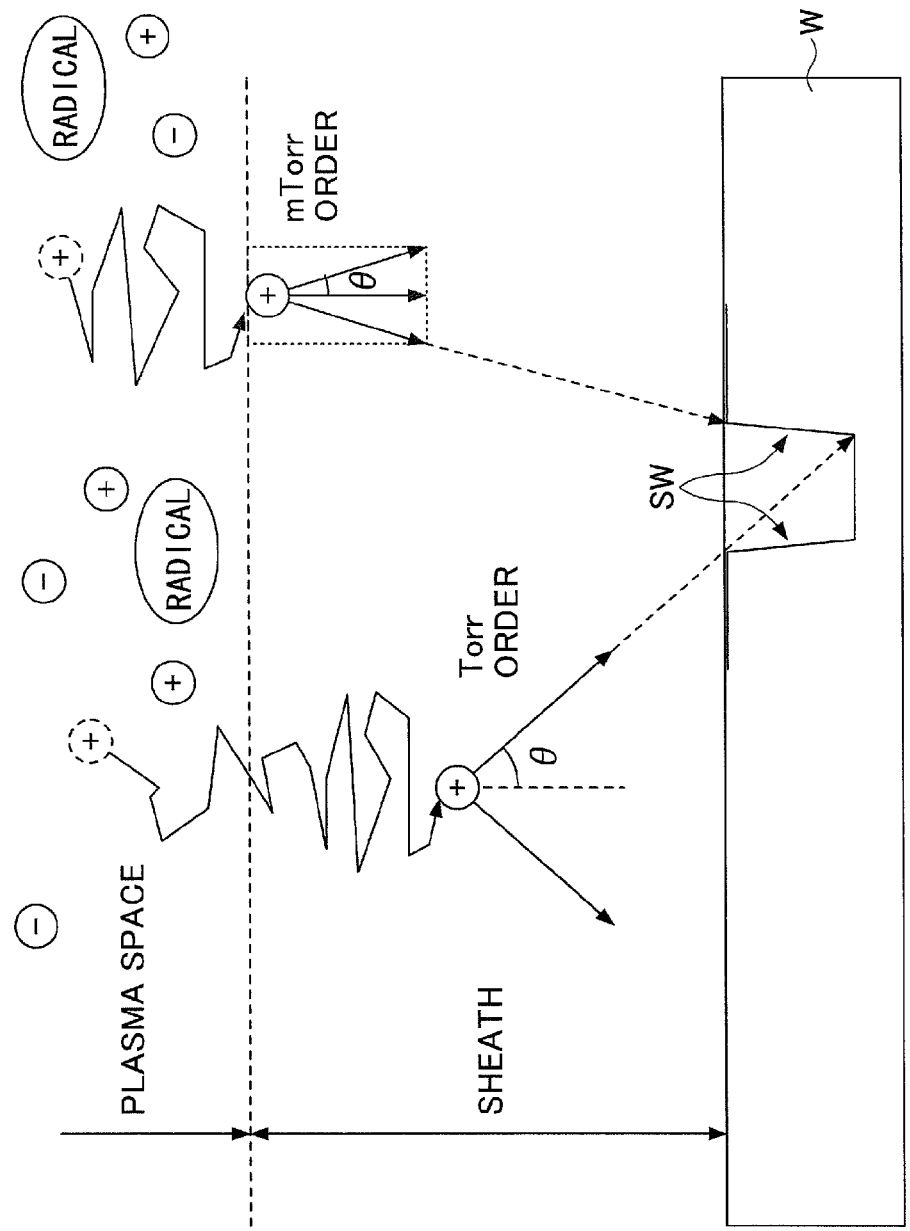
FIG. 5 illustrates principles of etching executed on a semiconductor device according to an embodiment of the present invention.
Figure 6:
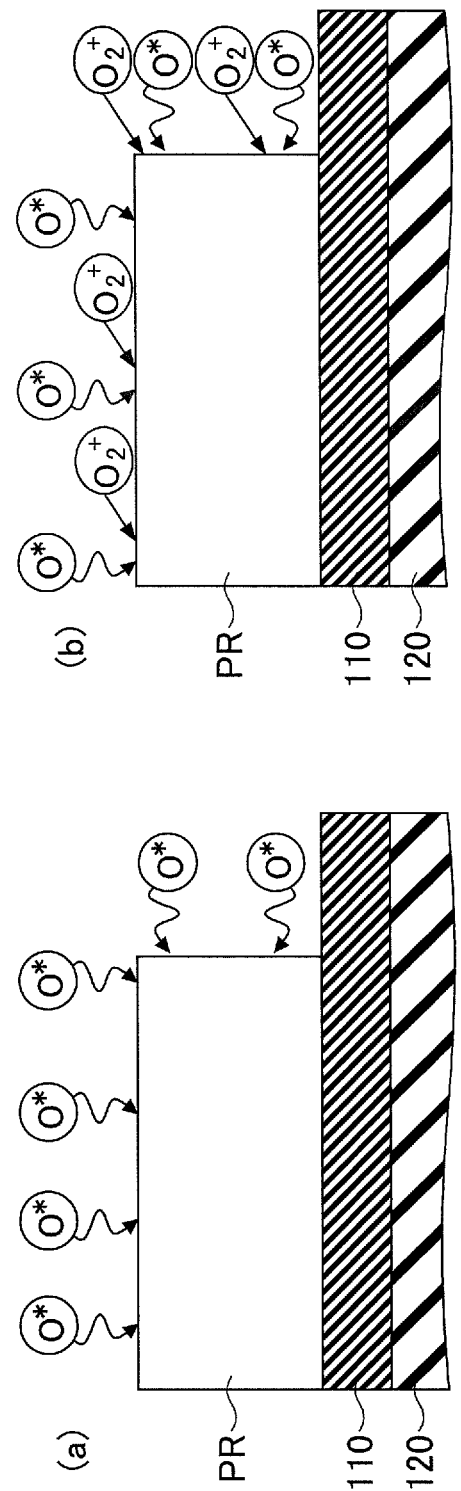
FIG. 6 illustrates principles of etching executed on a semiconductor device according to an embodiment of the present invention.

In the present embodiment, the relationship between the angle of ions incident on the substrate (ion angle) and the pressure is placed under scrutiny. As illustrated in FIG. 5, ions having positive charges, electrons having negative charges, and radicals having neutral charges of a plasma exist within a plasma space. The radicals primarily contribute to chemical etching through a chemical reaction between the radicals and the stacked layer film, and the ions primarily contribute to physical etching through bombardment of the ions against the substrate. As illustrated in FIG. 6, the radicals (O*) primarily contribute to isotropic etching of the photoresist layer PR. On the other hand, the direction of etching by the ions ($O_2$+) depends on the ion angle. When the ions within plasma enter a sheath region, the ions are accelerated by a voltage applied to the sheath and are thereby bombarded against the substrate.

In order to increase the etch rate for etching in the lateral direction by the ion energy, the incidence angle θ of the ions is ideally 45 degrees. When the incidence angle θ of the ions is less than 45 degrees, etching in the vertical direction tends to be encouraged by the ions as the incidence angle θ of the ions becomes smaller (i.e., as the incidence angle θ of the ions comes closer to 0 degrees). As a result, the ratio of lateral etching by the ion energy is decreased.

On the other hand, when the incidence angle θ of the ions is greater than 45 degrees, it becomes increasingly difficult for the ions to reach a bottom portion of a surface to be etched (side faces SW in FIG. 5) as the incidence angle θ of the ions becomes greater (i.e., as the incidence angle θ of the ions comes closer to 90 degrees). As a result, the contribution ratio of the ion energy to etching in the lateral direction is decreased.

Figure 7:
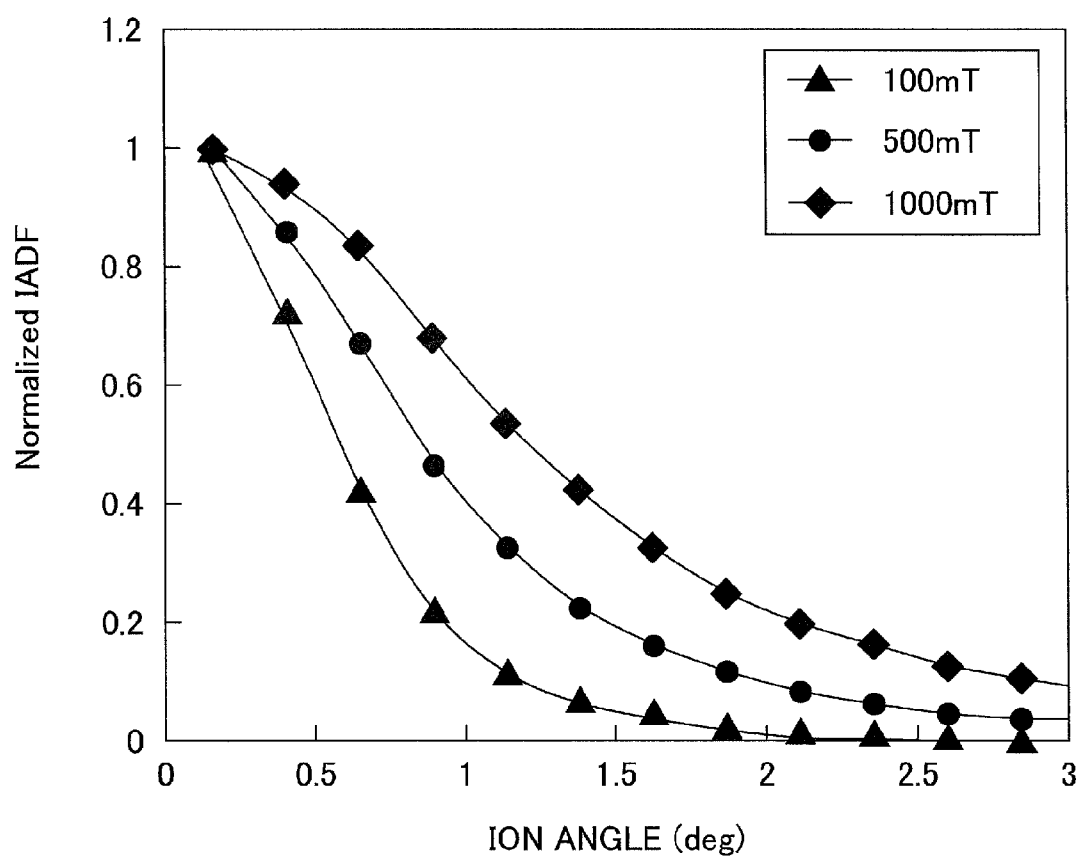
FIG. 7 is a graph illustrating an ion incidence angle depending on the pressure.
Figure 8:
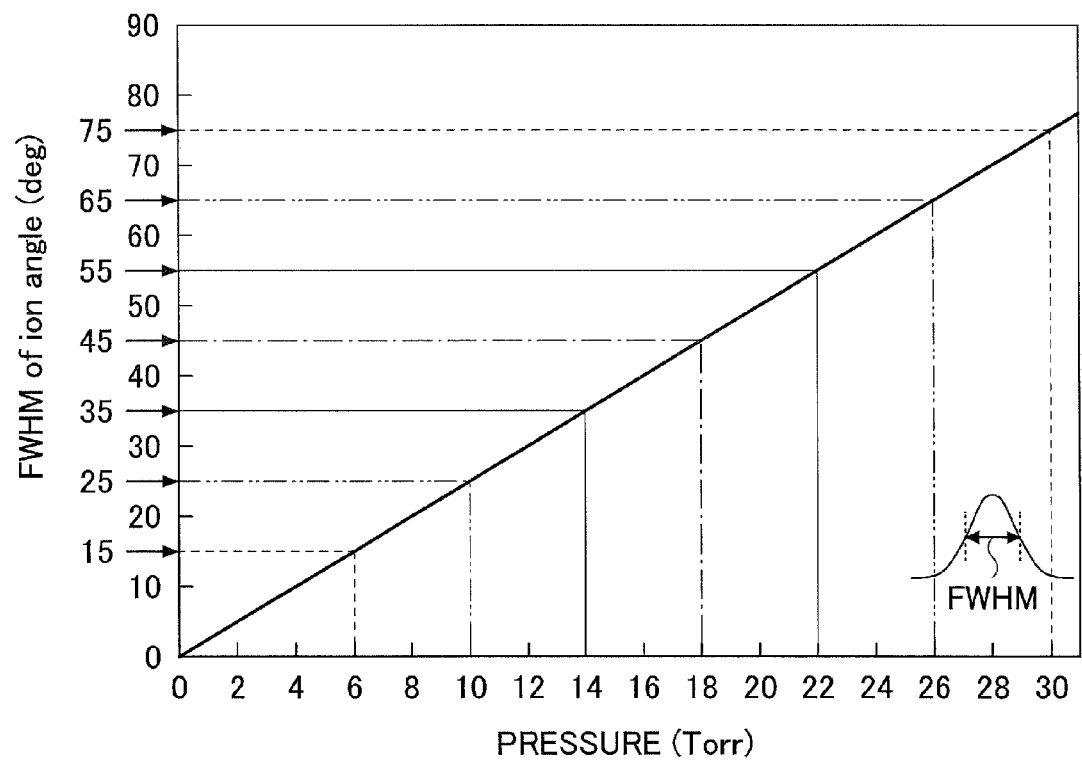
FIG. 8 is a graph illustrating an ion incidence angle depending on the pressure.

FIGS. 7 and 8 are graphs illustrating the relationship between the incidence angle of the ions and the pressure. In FIG. 7, the horizontal axis represents the incidence angle of the ions (ion angle) and the vertical axis represents the IADF (ion angle distribution function). As illustrated in FIG. 7, the ions within a plasma may be oriented in various angles. Also, the ion angle depends upon the pressure. Specifically, within a pressure region on the order of 100 mTorr, approximately 20% of the ions within the plasma are oriented at an ion diffusion angle (corresponding to the ion incidence angle) of one degree. At this angle, the ions hardly contribute to etching in the lateral direction. That is, as can be appreciated from the graphs of FIG. 7 representing the ion angle distributions under pressure ranges of 100 mTorr, 500 mTorr, and 1 Torr, as the pressure is increased, the ion diffusion angle becomes greater and the contribution ratio of the ions to etching in the lateral direction is increased. In other words, as the pressure is increased, the ratio of ions with larger incidence angles is increased and the number of ions contributing to etching in the lateral direction is increased. Accordingly, in the present embodiment, etching is performed under a high pressure range on the order of several Torr to increase the contribution ratio of the ions to etching in the lateral direction.

In FIG. 8, the horizontal axis represents the pressure (Torr) and the vertical axis represents the FWHM (Full-Width Half-Maximum) of the ion angle. The FWHM of the ion angle corresponds to one half (½) of a value obtained by subtracting a minimum value of the angle distribution from a maximum value of the angle distribution. The FWHM is an index of the ion having the most representative energy among the ions within the plasma. The pressure is preferably adjusted such that the representative ion has an incidence angle of 45 degrees. In this way, the contribution of ions to etching in the lateral direction may be maximized.

Referring to FIG. 8, when the FWHM of the ion angle is 45 degrees, the pressure is equal to 18 Torr. Thus, when the pressure is adjusted to 18 Torr, the contribution of ions to etching in the lateral direction may be maximized.

As preferred pressure conditions, the pressure may be within a range of 6-30 Torr such that the FWHM of the ion angle may be within a range of 15-75 degrees. For example, in the case of performing mask trimming in a lower side dual frequency application type semiconductor device manufacturing apparatus, by trimming the photoresist layer PR while applying biasing power to the lower electrode and maintaining the pressure within a range (6-30 Torr) such that the ion angle of the ions within the plasma may be 15-75 degrees, the etch rate for etching the photoresist layer PR may be increased and trimming at a high throughput may be enabled.

Note that when the pressure is adjusted to a high pressure range of 6-30 Torr, the ions are accelerated and the ions may collide at a higher frequency when the ions enter the sheath region as illustrated in FIG. 5. Thus, when the ions enter the sheath region, the ions may form an angle more easily owing to the collision, and as a result, the ion angles of the ions within the sheath region may be increased. Note that when the pressure is below 6 Torr, the frequency of collision of the ions within the plasma before they reach the substrate may be reduced, and the ions within the sheath region are less likely to four angles. As a result, the ions are more likely to be incident in a vertical direction with respect to the substrate, and the contribution of the ions to etching in the lateral direction may be reduced relative to their contribution to etching in the vertical direction. When the pressure is above 30 Torr, the frequency of collision of the ions within the plasma before they reach the substrate is increased such that the ion energy is reduced. As a result, the contribution of the ions to etching in the lateral direction may be reduced.

In view of the above, in the second step of the present embodiment, the pressure within a processing chamber is adjusted to 6-30 Torr so that the ion diffusion angle of the ions within the plasma may be 15-75 degrees, and a high frequency power for plasma generation and a high frequency power for biasing are applied to the lower electrode. A plasma generated in this way is used to etch the photoresist layer PR to reduce the area of the photoresist layer PR in the lateral direction.

In a preferred embodiment, the pressure within the processing chamber may be adjusted to be within a range of 10-26 Torr so that the ion diffusion angle may be within a range of 25-65 degrees.

In a further preferred embodiment, the pressure within the processing chamber may be adjusted to be within a range of 14-22 Torr so that the ion diffusion angle may be within a range of 35-55 degrees.

[Experimental Results of Lateral Etching (Second Step)]

Based on the above principles, experiments were conducted as described below. First, based on the relationship between the ion angle and the pressure as illustrated in FIG. 7, experiments were conducted under three different conditions by varying the pressure to 1 Torr (133.322 Pa), 5 Torr (666.61 Pa), and 9 Torr (1199.898 Pa).

To determine the extent to which etching of the mask material in the lateral direction is encouraged, experiments were conducted using a lower side dual frequency power application type semiconductor device manufacturing apparatus that is configured to apply a high frequency power for plasma generation and a high frequency power for biasing to a lower electrode (capacitively coupled plasma processing apparatus of FIG. 3) and an upper/lower side power application type semiconductor manufacturing apparatus that is configured to apply a high frequency power for plasma generation to an upper electrode and apply a high frequency power for biasing to a lower electrode (not shown). FIG. 9 illustrates experimental results of using the lower side dual frequency power application type semiconductor device manufacturing apparatus (referred to as "plasma processing apparatus A" hereinafter) in which an electrode gap between the upper electrode and the lower electrode (referred to as "gap" hereinafter) is comparatively smaller. FIG. 10 illustrates experimental results of using the upper/lower side power application type semiconductor manufacturing apparatus (referred to as "plasma processing apparatus B" hereinafter) in which the gap between the upper electrode and the lower electrode is comparatively larger. Note that the plasma processing apparatus A and the plasma processing apparatus B are capacitively coupled plasma processing apparatuses.

(Experimental Results of Lateral Etching by Plasma Processing Apparatus A)

In the following, the experimental results of FIG. 9 from executing the lateral etching step (second step) using the plasma processing apparatus A are described. The process conditions used for etching the photoresist layer PR in the lateral etching step (second step) are indicated below. Note that in the present experiment, a wafer W having a diameter of 300 nm was used. The experiments were conducted under nine different sets of conditions by adopting three different power levels of 0 W (Comparative Example), 200 W (Embodiment 1), and 500 W (Embodiment 2) as the high frequency power of the first high frequency power supply in combination with three different pressures of 1 Torr, 5 Torr, and 9 Torr for the processing chamber. Note that the high frequency power measurement $W/cm^2$ corresponds to a value indicating the power (W) applied per unit area ($cm^2$).

Plasma Processing Apparatus A

| | |
|---|---|
| Gap | 35 mm |
| High Frequency Power Application Method | Lower side dual frequency |
| Frequency of Second High Frequency Power Supply (HF) | 100 MHz |
| High Frequency Power of Second High Frequency Power Supply | 1000 W (1.415 $W/cm^2$) |

-continued

| | |
|---|---|
| Frequency of First High Frequency Power Supply (LF) | 3.2 MHz |
| High Frequency Power of First High Frequency Power Supply | Comparative Example: 0 W/cm$^2$ Embodiment 1: 200 W (0.28 W/cm$^2$) Embodiment 2: 500 W (0.71 W/cm$^2$) |
| Gas Type | O$_2$ (Processing chamber seal) |
| Heat Transfer Gas | He 20 Torr |
| Pressure | 3 Conditions: 1, 5, 9 Torr |

Note that the above "processing chamber seal" refers to filling the processing chamber with oxygen (O$_2$) gas and closing an APC (automatic pressure controller) after the pressure within the processing chamber reaches a predetermined pressure to thereby seal the gas within the processing chamber. The photoresist layer PR is etched after sealing the gas in the above manner.

In the present experiment, etching is performed under the above process conditions. Note that in the Comparative Example, the first high frequency power LF for drawing in ions from within the plasma is not applied. That is, in the Comparative Example, ions do not actively contribute to etching the photoresist layer PR, and etching is encouraged mainly by radicals as in the conventional method.

On the other hand, in Embodiment 1, a first high frequency power LF of 0.28 (W/cm$^2$) is applied to the lower electrode. In Embodiment 2, a first high frequency power LF of 0.71 (W/cm$^2$) is applied to the lower electrode. Accordingly, in Embodiment 1 and Embodiment 2, etching is encouraged by ions and radicals. Thus, under a high pressure atmosphere, ions may actively contribute to etching in Embodiment 1 and Embodiment 2.

Referring to the experimental results of FIG. 9, in the cases where the pressure is 5 Torr and 9 Torr, the photoresist layer trim ratios in Embodiment 1 and Embodiment 2 are the same or higher than the photoresist layer trim ratio in the Comparative Example. Specifically, in the case where the pressure is 5 Torr, the photoresist layer trim ratio in Embodiment 2 is the same as the photoresist layer trim ratio in the Comparative Example. On the other hand, the photoresist layer trim ratio in Embodiment 1 when the pressure is 5 Torr, and the photoresist layer trim ratios in Embodiment 1 and Embodiment 2 when the pressure is 9 Torr are higher than the photoresist layer trim ratio in the Comparative Example. Notably, when the pressure is 9 Torr, the photoresist layer trim ratio in Embodiment 1 is approximately two times the photoresist layer trim ratio in the Comparative Example.

Thus, based on the experiments conducted under the three different pressures of 1, 5, and 9 Torr, it can be appreciated that the photoresist layer trim ratio may be increased as the pressure is increased and the first high frequency power LF is applied. That is, the above experimental results indicate that in the case where the plasma processing apparatus A is used, ions within the plasma may effectively contribute to etching in the lateral direction when the pressure within the processing chamber is higher than 5 Torr and the first high frequency power LF for biasing is within a range of 0.28-0.71 (W/cm$^2$).

(Experimental Results of Lateral Etching by Plasma Processing Apparatus B)

In the following, the experimental results of FIG. 10 from executing the lateral etching step (second step) using the upper/lower side power application type plasma processing apparatus B with the wider gap are described. The process conditions used for etching the photoresist layer PR in the lateral etching step (second step) are indicated below. The experiments were conducted under twelve different sets of conditions by adopting three different power levels of 0 W (Comparative Example), 200 W (Embodiment 1), and 500 W (Embodiment 2) as the high frequency power of the first high frequency power supply in combination with four different pressures of 0.1 Torr, 0.5 Torr, 1 Torr, and 5 Torr for the processing chamber.

Plasma Processing Apparatus B

| | |
|---|---|
| Gap | 87 mm |
| High Frequency Power Application Method | Upper/lower side dual frequency |
| Frequency of Second High Frequency Power Supply (HF) | 60 MHz |
| High Frequency Power of Second High Frequency Power Supply | 1000 W (1.415 W/cm$^2$) |
| Frequency of First High Frequency Power Supply (LF) | 13.56 MHz |
| High Frequency Power of First High Frequency Power Supply | Comparative Example: 0 W/cm$^2$ Embodiment 1: 200 W (0.28 W/cm$^2$) Embodiment 2: 500 W (0.71 W/cm$^2$) |
| Gas Type | O$_2$ (Processing chamber seal) |
| Heat Transfer Gas | He 20 Torr |
| Pressure | 4 Conditions: 0.1, 0.5, 1, 5 Torr |

In the present experiment, etching is performed under the above process conditions. Note that in the Comparative Example, the first high frequency power LF for drawing ions from within the plasma is not applied. That is, in the Comparative Example, ions do not actively contribute to etching the photoresist layer PR, and etching is encouraged mainly by radicals as in the conventional method.

On the other hand, in Embodiment 1, a first high frequency power LF of 0.28 (W/cm$^2$) is applied to the lower electrode. In Embodiment 2, a first high frequency power LF of 0.71 (W/cm$^2$) is applied to the lower electrode. Accordingly, in Embodiment 1 and Embodiment 2, etching is encouraged by ions and radicals. Thus, under a high pressure atmosphere, ions are expected to actively contribute to etching in Embodiment 1 and Embodiment 2.

However, as can be appreciated from the experimental results of FIG. 10, a notable increase in the photoresist layer trim ratio in accordance with the increase in pressure cannot be observed. Also, in the case where the high frequency power of the first high frequency power supply is 0 W, even with a pressure of 0.1 Torr at which the highest lateral etch rate is achieved, the lateral etch rate is still no more than 20 nm/min indicating that the photoresist layer PR is hardly etched in the lateral direction.

Figure 11:
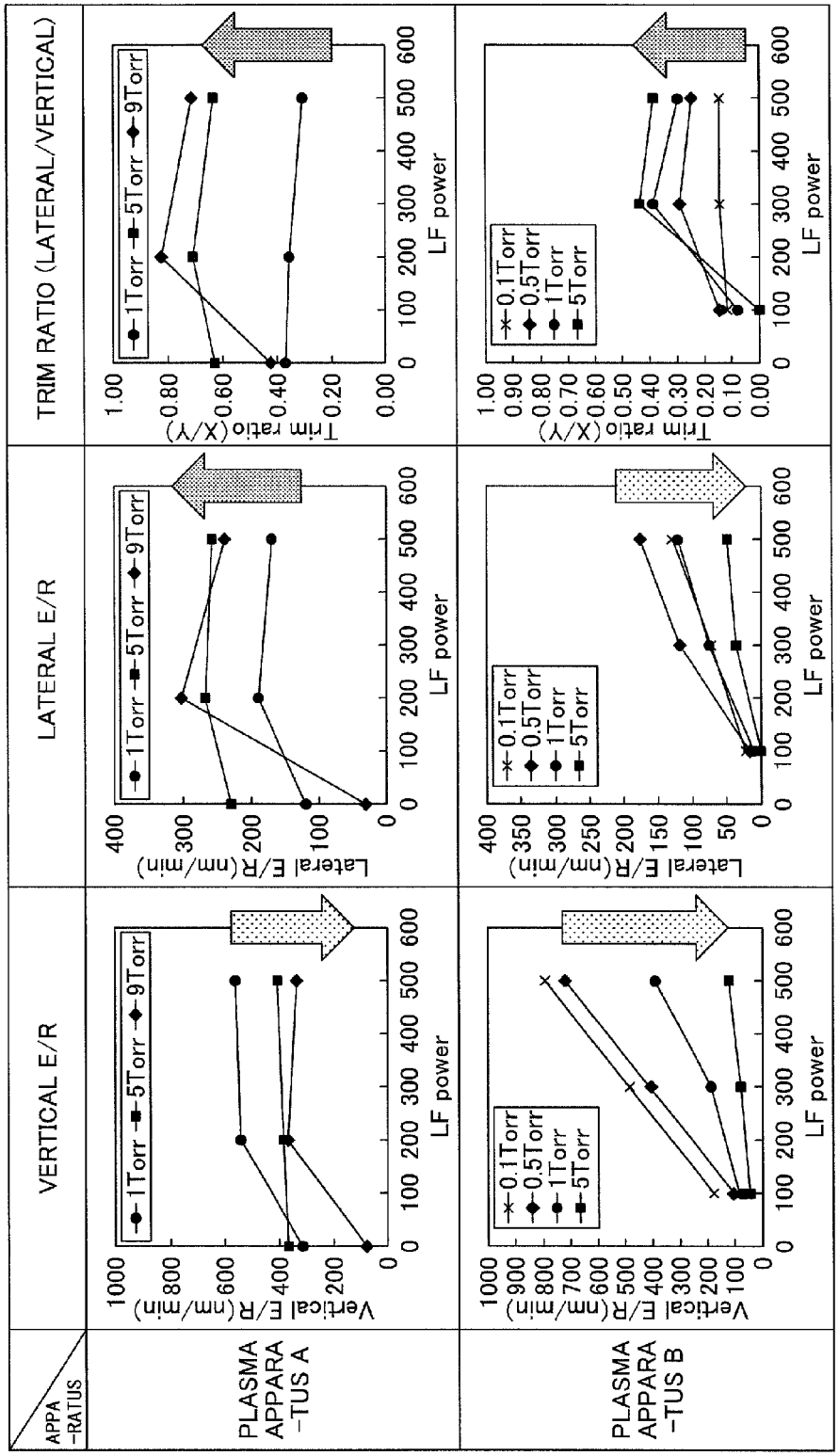
FIG. 11 illustrates graphs numerically representing the experimental results of FIGS. 9 and 10.

FIG. 11 illustrates graphic comparisons of the experimental results of FIGS. 9 and 10. The plasma processing apparatus A of FIG. 11 corresponds to the semiconductor device manufacturing apparatus that was used to execute the etching process under the process conditions indicated in FIG. 9. The plasma processing apparatus B of FIG. 11 corresponds to the semiconductor device manufacturing apparatus that was used to execute the etching process under the process conditions indicated in FIG. 10.

As can be appreciated from FIG. 11, in the plasma processing apparatus A, when a high frequency power LF for biasing is applied according to Embodiment 1 and Embodiment 2 and when the pressure is adjusted to 9 Torr, the photoresist layer trim ratio is substantially increased compared to the photoresist layer trim ratio of the Comparative Example. That is, when a high frequency power LF for biasing is applied as in Embodiment 1 and Embodiment 2 and when the pressure is adjusted to a high pressure in the plasma processing apparatus A, a substantial increase in the photoresist trim ratio may be observed.

On the other hand, in the plasma processing apparatus B, when a high frequency power LF for biasing is applied according to Embodiment 1 and Embodiment 2 and when the pressure is adjusted to 5 Torr, the photoresist layer trim ratio does not rise to a level as high as the photoresist layer trim ratio achieved by the plasma processing apparatus A. That is, when a high frequency power LF for biasing is applied as in Embodiment 1 and Embodiment 2 and the pressure is adjusted to a high pressure in the plasma processing apparatus B, the lateral etch rate tends to be lower compared to cases where a lower pressure is used and an increase in the lateral etch rate relative to an increase in the high frequency power LF is rather small. Referring to the graphs representing the photoresist layer trim ratios in FIG. 11, when the pressure is 5 Torr and a high frequency power LF of 500 W for biasing is applied in the plasma processing apparatus A, the photoresist layer trim ratio is greater than 0.6. On the other hand, when the pressure is 5 Torr and a high frequency power LF of 500 W for biasing is applied in the plasma processing apparatus B, the photoresist layer trim ratio is less than 0.4. That is, in this case, the photoresist layer trim ratio in the plasma processing apparatus A is approximately 1.5 times the photoresist layer trim ratio in the plasma processing apparatus B. Further, the photoresist layer trim ratio in the plasma processing apparatus A when the pressure is 9 Torr and a high frequency power LF of 500 W is applied is approximately 2 times the photoresist layer trim ratio in the plasma processing apparatus B when the pressure is 5 Torr.

(Gap Between Upper Electrode and Lower Electrode)

The gap between the upper electrode and the lower electrode in the plasma processing apparatus B is greater than the gap in the plasma processing apparatus A. Also, in the plasma processing apparatus B, the high frequency power for plasma generation is applied to the upper electrode, and as a result, a plasma is generated near the upper electrode. On the other hand, in the plasma processing apparatus A, the high frequency power for plasma generation is applied to the lower electrode, and as a result, a plasma is generated near the lower electrode. Accordingly, in the plasma processing apparatus B, the travel distance of ions within the plasma before they reach the substrate is relatively long. Thus, in the plasma processing apparatus B, the ions within the plasma collide with numerous gases before they reach the substrate, and as a result, most of the ion energy may be depleted.

On the other hand, in the plasma processing apparatus A, the travel distance of ions within the plasma before they reach the substrate is relatively short. Accordingly, in the plasma processing apparatus A, the ions within the plasma are less likely to collide with gases before reaching the substrate in comparison to the plasma processing apparatus B. As a result, the loss of ion energy before the ions reach the substrate may not be so large in the plasma processing apparatus A.

In contrast to the plasma processing apparatus A with a smaller gap, in the plasma processing apparatus B, etching in the lateral direction may not be adequately encouraged and the lateral etch rate may not be adequately increased even under process conditions where a high frequency power for biasing is applied and the pressure is adjusted to a high pressure of several Torr. Based on the above, to increase the photoresist layer trim ratio, the gap between the upper electrode and the lower electrode is preferably arranged to be within a range of 20-40 mm and the high frequency power for biasing is preferably applied to the lower electrode.

(Inductively Coupled Plasma Processing Apparatus)

In a case where an inductively coupled plasma processing apparatus (not shown) is used, owing to structural constraints of the apparatus, plasma uniformity is degraded when the gap is narrowed. Specifically, in the inductively coupled plasma processing apparatus, a coil is arranged outside the chamber and a dielectric window is formed at a ceiling portion of the chamber positioned below the coil. Electromagnetic waves emitted from the coil pass through the dielectric window to be introduced into the chamber. The intensity distribution of the electromagnetic waves introduced into the chamber has a pattern substantially corresponding to the shape of the coil. Thus, when a plasma is generated within the chamber, a circular high density plasma portion is created within the chamber according to a high intensity electromagnetic wave pattern. In order to prevent such unevenness in the plasma density, the gap needs to be widened to enable diffusion of the plasma. Thus, in view of such structural constraints of the inductively coupled plasma processing apparatus, a relatively wide gap needs to be secured in order to achieve in-plane uniformity for microfabrication.

Thus, as with the plasma processing apparatus B, in the inductively coupled plasma processing apparatus, the travel distance of ions travelling from within the plasma to the substrate may be relatively long. Accordingly, even when the pressure is adjusted to a high pressure of several Torr, the ions within the plasma are likely to collide with numerous gases before reaching the substrate such that most of the ion energy may be depleted. As a result, etching in the lateral direction may not be adequately encouraged, and the lateral etch rate may not be adequately increased.

[Effects]

As described above, in the present embodiment, the photoresist layer PR, which is formed on the multilayer film ml, is etched by an etching process that satisfies all of the following process conditions (1)-(4).

(1) Etching is performed using a parallel plate type plasma processing apparatus (capacitively coupled plasma processing apparatus) in which the gap between the upper electrode and the lower electrode is 20-40 mm.

(2) The high frequency power for plasma generation (HF) is applied to the lower electrode.

(3) The pressure within the processing chamber is adjusted to be greater than or equal to 6 Torr and less than or equal to 30 Torr such that the diffusion angle of the ions within the plasma may be greater than or equal to 15 degrees and less than or equal to 75 degrees.

(4) The high frequency power for biasing (LF) is applied to the lower electrode. A high frequency power of 0.28-0.71 (W/cm$^2$) is preferably applied as the high frequency power for biasing.

By implementing the above process conditions, the photoresist layer trim ratio may be increased and the lateral etch rate may be increased. Accordingly, in the second step of the present embodiment, the photoresist layer PR may be etched in the lateral direction at a desirable etch rate to reduce the area of the photoresist layer PR in the lateral direction. In this way, the throughput may be increased. Also, the photoresist layer PR may be prevented from being removed while the multilayer film ml is still being etched into a stepped configuration.

Although illustrative embodiments of a semiconductor device manufacturing method according to the present invention have been described above with reference to the accompanying drawings, the present invention is not limited to these embodiments. That is, numerous variations and modifications will readily occur to those skilled in the art, and the present invention includes all such variations and modifications that may be made without departing from the scope of the present invention.

For example, in the second step of the above-described embodiment, $O_2$ gas (process chamber seal) is used as a processing gas. However, a semiconductor device manufacturing method according to the present invention is not limited to the above embodiment, and for example, the processing gas used in the second step may include at least one gas selected from a group consisting of $O_2$, $H_2$, $N_2$, CO, and $CO_2$. Also, although the gas is supplied in a sealed state in the second step of the above embodiment, in other embodiments, a desired gas may be continually supplied in an ordinary manner at a predetermined gas flow rate.

Also, the workpiece subject to a plasma process in the present invention is not limited to a semiconductor wafer but may be a large substrate for a flat panel display (FPD), an electroluminescence (EL) element, or a substrate for a solar battery, for example.

Also, in a semiconductor device manufacturing method according to an embodiment of the present invention, the pressure within the processing chamber may be adjusted to be greater than or equal to 10 Torr and less than or equal to 26 Torr in the second step.

Further, the pressure within the processing chamber may be adjusted to be greater than or equal to 14 Torr and less than or equal to 22 Torr in the second step.

Also, a high frequency power for biasing that is greater than or equal to 0.28 W/cm$^2$ and less than or equal to 0.71 W/cm$^2$ may be applied to the lower electrode in the second step.

Also, at least one gas selected from a group consisting of $O_2$, $H_2$, $N_2$, CO, and $CO_2$ may be used as a processing gas in the second step.

Also, the first film may be made of a silicon oxide film and the second film may be made of a silicon nitride film.

Also, the multilayer film may have at least sixteen layers of the first film and the second film alternately stacked on each other.

The present application is based on and claims the benefit of priority of Japanese Patent Application No. 2012-033372 filed on Feb. 17, 2012, and U.S. Provisional Application No. 61/603,405 filed on Feb. 27, 2012, the entire contents of which are herein incorporated by reference.

DESCRIPTION OF THE REFERENCE NUMERALS 10 plasma processing apparatus
11 chamber
12 mounting table (lower electrode)
31 first high frequency power supply (for biasing)
32 second high frequency power supply (for plasma generation)
38 shower head (upper electrode)
62 gas supply source
80 control device
110 first film
120 second film
PR photoresist film

The invention claimed is:

1. A semiconductor device manufacturing method that includes introducing a processing gas into a parallel plate type plasma processing apparatus including an upper electrode and a lower electrode, applying a high frequency power to the lower electrode, generating a plasma within the plasma processing apparatus, etching with the plasma a multilayer film including a first film and a second film with differing dielectric constants alternately stacked on a substrate using a photoresist layer arranged on the multilayer film as a mask, and forming the multilayer film into a stepped configuration, the semiconductor device manufacturing method comprising:
   a first step of etching the first film using the photoresist layer as the mask;
   a second step of adjusting a pressure within a processing chamber of the plasma processing apparatus to be greater than or equal to 6 Torr and less than or equal to 30 Torr, generating the plasma by applying a first high frequency power for biasing and a second high frequency power for plasma generation to the lower electrode, and etching the photoresist layer using the generated plasma to reduce an area of the photoresist layer in a lateral direction;
   a third step of etching the second film using the photoresist layer and the first film, which are previously etched by the first and second steps, respectively as the mask; and
   repeating the first step through the third step a predetermined number of times.

2. The semiconductor device manufacturing method as claimed in claim 1, wherein the pressure within the processing chamber is adjusted to be greater than or equal to 10 Torr and less than or equal to 26 Torr in the second step.

3. The semiconductor device manufacturing method as claimed in claim 2, wherein the pressure within the processing chamber is adjusted to be greater than or equal to 14 Torr and less than or equal to 22 Torr in the second step.

4. The semiconductor device manufacturing method as claimed in claim 1, wherein the first high frequency power for biasing that is greater than or equal to 0.28 W/cm$^2$ and less than or equal to 0.71 W/cm$^2$ is applied to the lower electrode in the second step.

5. The semiconductor device manufacturing method as claimed in claim 1, wherein at least one gas selected from a group consisting of $O_2$, $H_2$, $N_2$, CO, and $CO_2$ is used as the processing gas in the second step.

6. The semiconductor device manufacturing method as claimed in claim 1, wherein the first film is made of a silicon oxide film and the second film is made of a silicon nitride film.

7. The semiconductor device manufacturing method as claimed in claim 1, wherein the multilayer film includes at least sixteen layers of the first film and the second film alternately stacked on each other.

8. The semiconductor device manufacturing method as claimed in claim 1, wherein the second step includes a step of increasing the pressure within the processing chamber of the plasma processing apparatus to be greater than or equal to 6 Torr and less than or equal to 30 Torr and increasing an etch rate so that an etch rate in a lateral direction of the multilayer film is larger than an etch rate in a vertical direction of the multilayer film.

* * * * *